(12) United States Patent
Lin et al.

(10) Patent No.: US 10,509,886 B2
(45) Date of Patent: Dec. 17, 2019

(54) METHOD, SYSTEM, AND STORAGE MEDIUM FOR RC EXTRACTION USING HIERARCHICAL MODELING ARCHITECTURE

(71) Applicant: TAIWAN SEMICONDUCTOR MANUFACTURING COMPANY LTD., Hsinchu (TW)

(72) Inventors: Chin-Shen Lin, Taipei (TW); Meng-Xiang Lee, Yunlin County (TW); Kuo-Nan Yang, Hsinchu (TW); Chung-Hsing Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 116 days.

(21) Appl. No.: 15/844,313

(22) Filed: Dec. 15, 2017

(65) Prior Publication Data

US 2019/0138684 A1 May 9, 2019

Related U.S. Application Data

(60) Provisional application No. 62/582,504, filed on Nov. 7, 2017.

(51) Int. Cl.
*G06F 17/50* (2006.01)

(52) U.S. Cl.
CPC ........ *G06F 17/5081* (2013.01); *G06F 17/505* (2013.01); *G06F 17/5036* (2013.01)

(58) Field of Classification Search
CPC ............ G06F 17/5036; G06F 17/5031; G06F 17/505; G06F 17/5081; G06F 17/5068; G06F 2217/82; G06F 17/5022; G06F 17/5045; G06F 17/5063; G06F 17/5072; G06F 2217/02; G06F 2217/06
USPC .................................................. 716/103–115
See application file for complete search history.

(56) References Cited

U.S. PATENT DOCUMENTS

| | | | | |
|---|---|---|---|---|
| 5,878,053 A * | 3/1999 | Koh | ................... | G06F 17/5036 703/18 |
| 6,871,334 B2 * | 3/2005 | Mabuchi | ............. | G06F 17/5036 716/115 |
| 7,016,820 B2 * | 3/2006 | Kimura | ............... | G06F 17/5036 700/121 |
| 7,243,313 B1 * | 7/2007 | Qin | ..................... | G06F 17/5036 716/113 |

* cited by examiner

*Primary Examiner* — Nghia M Doan
(74) *Attorney, Agent, or Firm* — WPAT, P.C., Intellectual Property Attorneys; Anthony King (57) ABSTRACT

A method performed by at least one processor includes: accessing a layout of an integrated circuit (IC), the layout comprising a resistor-capacitor (RC) netlist comprising a plurality of circuit nodes; identifying an RC network in the RC netlist; determining a characterization matrix corresponding to the RC network; updating the RC netlist by replacing the RC network with the characterization matrix; and calculating voltages and currents of the plurality of circuit nodes based on the updated RC netlist.

20 Claims, 10 Drawing Sheets

METHOD, SYSTEM, AND STORAGE MEDIUM FOR RC EXTRACTION USING HIERARCHICAL MODELING ARCHITECTURE

PRIORITY CLAIM AND CROSS-REFERENCE

This application claims priority to U.S. patent application Ser. No. 62/582,504 filed 7 Nov. 2017, the disclosure of which is hereby incorporated by reference in its entirety.

BACKGROUND

In advanced semiconductor fabrication technologies, the feature density and operating frequency of devices are being progressively raised in order to achieve better performance with reduced footprint. To enable such advances, electronic design automation tools are widely used for facilitating design flows and ensuring the functional integrity of the manufactured integrated circuits (IC). The electronic design automation tools aid in establishing a software platform to evaluate the physical performance and electrical properties of the IC before the chip is fabricated. A variety of built-in device models and design rules are used to verify the performance of the circuit design, such as the functionality, power consumption, and feature geometries. The software platform can also simulate the physical behaviors and characteristics of the IC components in operation. As the semiconductor technology evolves, the component count of the IC increases, and the required computational resources and simulation time for the simulation grow accordingly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a hierarchical modeling architecture is proposed to enhance the simulation efficiency of the electronic design automation (EDA) tool. As device sizes are being reduced while operation frequencies are increasing, the simulation tasks for design and manufacturing become more and more challenging. Specifically, as the device features are getting more crowded, the simulation of the device becomes increasingly complicated while the quantity of circuit nodes in the device is increased and their interactions are more prominent. When the EDA tool is leveraged to simulate the circuit design, the computing resources (CPU, RAM, etc.) consumed and processing time increase dramatically. Among the features of the circuit design, some subsets may share common properties and electrical behaviors. As such, the hierarchical modeling architecture takes advantage of the common features of the circuit subsets and tries to simplify the circuit design netlist by replacing those common circuit subsets with a characterization matrix. As a result, a multi-step simulation framework is provided that initially calculates the circuit design parameters of the simplified circuit netlist. The computational efforts can be reduced and the simulation efficiency can be improved accordingly.

Figure 1:
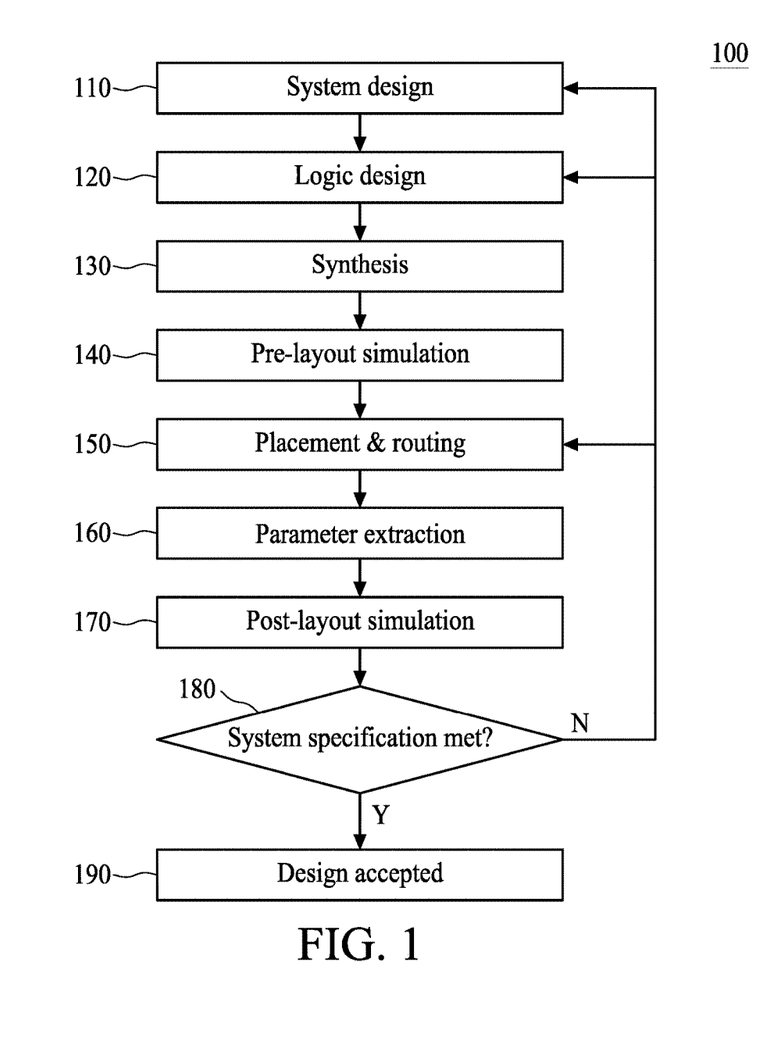
FIG. 1 is a schematic diagram illustrating a design flow of a chip, in accordance with some embodiments.

FIG. 1 is a schematic diagram illustrating a design flow 100 of a semiconductor chip, in accordance with some embodiments. The design flow 100, employed for designing semiconductor integrated chips (ICs), utilizes one or more EDA tools to perform operations therein. A workstation or personal computer is typically used in executing the tools to accomplish the design flow 100. The design flow 100 comprises a system design stage 110, a logic design stage 120, a synthesis stage 130, a pre-layout simulation stage 140, a placement and routing development stage 150, a parameter extraction stage 160 and a post-layout simulation stage 170.

Initially, at the system design stage 110, a systematic architecture for the chip of interest is provided with a high-level description. At stage 110, the chip functions along with performance requirements are determined according to a design specification. The chip functions are usually represented by respective schematic functional modules or blocks. In addition, an optimization or performance trade-off may be sought to achieve the design specifications with affordable cost and power.

At the logic design stage 120, the functional modules or blocks are described in a register transfer level (RTL) using a hardware description language. Commercially available language tools are generally used, for example, Verilog or VHDL. In an embodiment, a preliminary functionality check is performed at stage 120 to verify if the implemented functions conform to the specifications set forth in stage 110.

Subsequently, at the synthesis stage 130, the modules in the RTL descriptions are converted into a netlist data where the circuit structures, e.g., logic gates and registers, of each function module are established. In some embodiments, mapping of logic gates and registers to available cells in the standard cell libraries is conducted. Further, the netlist data is offered to describe the functional relationship of the chip in a gate level. In an embodiment, the netlist data is transformed from a gate-level view to a transistor-level view.

Subsequently, the gate-level netlist data is verified at the pre-layout simulation stage 140. During the verification process of stage 140, if some of the functions fail the verification in the simulation, the design flow 100 may be paused temporarily or may go back to stage 110 or stage 120 for further circuit design modification. After completion of the pre-layout simulation stage 140, the chip design has passed a preliminary verification and completed the front-end design process. Consequently, a back-end physical design process follows.

At the placement and routing stage 150, a physical architecture representing the chip determined during the front-end process is implemented. The layout development may involve a placement operation and a routing operation in series. Detailed structure and associated geometry for the components of the chip are determined in the placement operation. Interconnects among different components are routed subsequent to the placement operation. Both placement and routing operations are performed to meet a design rule check (DRC) deck to ensure that the manufacturing requirements of the chip are fulfilled. In an embodiment, the DRC deck includes a set of parameters, such as maximal length, minimal length, minimal separation distance, etc., for the discrete elements. Once the stage 150 is completed, a placed-and-routed layout is created and a netlist along with data on placement and routing is generated accordingly.

At the parameter extraction stage 160, a layout parameter extraction (LPE) operation is conducted to derive layout-dependent parameters, such as parasitic resistance and capacitance, resulting from the layout developed in stage 150. Consequently, a post-layout netlist data is then generated, which includes the layout-dependent parameters. In an embodiment, other simulations are conducted to evaluate the voltages and currents at the nodes in the post-layout netlist. The node voltage and node current values may reflect the received voltage and current values for each circuit element in the chip. The voltage and current data may be checked against the design rules to determine if the post-layout netlist can function properly or meets the specifications. In an embodiment, subsequent to stage 160, a timing analysis is performed to access the timing behavior of the designed chip incorporating the layout-dependent resistance and capacitance. The acquired voltages and currents of the nodes in the post-layout netlist are also employed for the timing analysis.

At the post-layout simulation stage 170, a physical verification is performed taking into consideration the parameters acquired in previous stages. A simulation of transistor-level behavior is conducted to examine whether the chip performance meets the required system specifications. In some embodiments, the post-layout simulation is performed to minimize possibilities of electrical issues or lithographic issues during the chip manufacturing process.

Next, it is determined during stage 180 whether the post-layout netlist meets the design specifications. If affirmative, the circuit design is accepted at stage 190 and then signed off accordingly. The chip is manufactured according to the accepted post-layout netlist. However, if the result of the post-layout simulation is unfavorable, the design flow 100 loops back to previous stages for tuning functionalities or structures. For example, the design flow 100 may loop back to stage 150 where the layout is re-developed to fix issues from a physical perspective. Alternatively, the design flow 100 may retreat to an earlier stage 110 or 120 to recast the chip design from a functional level in case the problems cannot be resolved within the back-end process.

The design flow 100 illustrated in FIG. 1 is exemplary. Modifications of the above-mentioned stages, such as change of order for the stages, partition of the stages, and deletion or addition of stages, are within the contemplated scope of the present disclosure.

Figure 2:
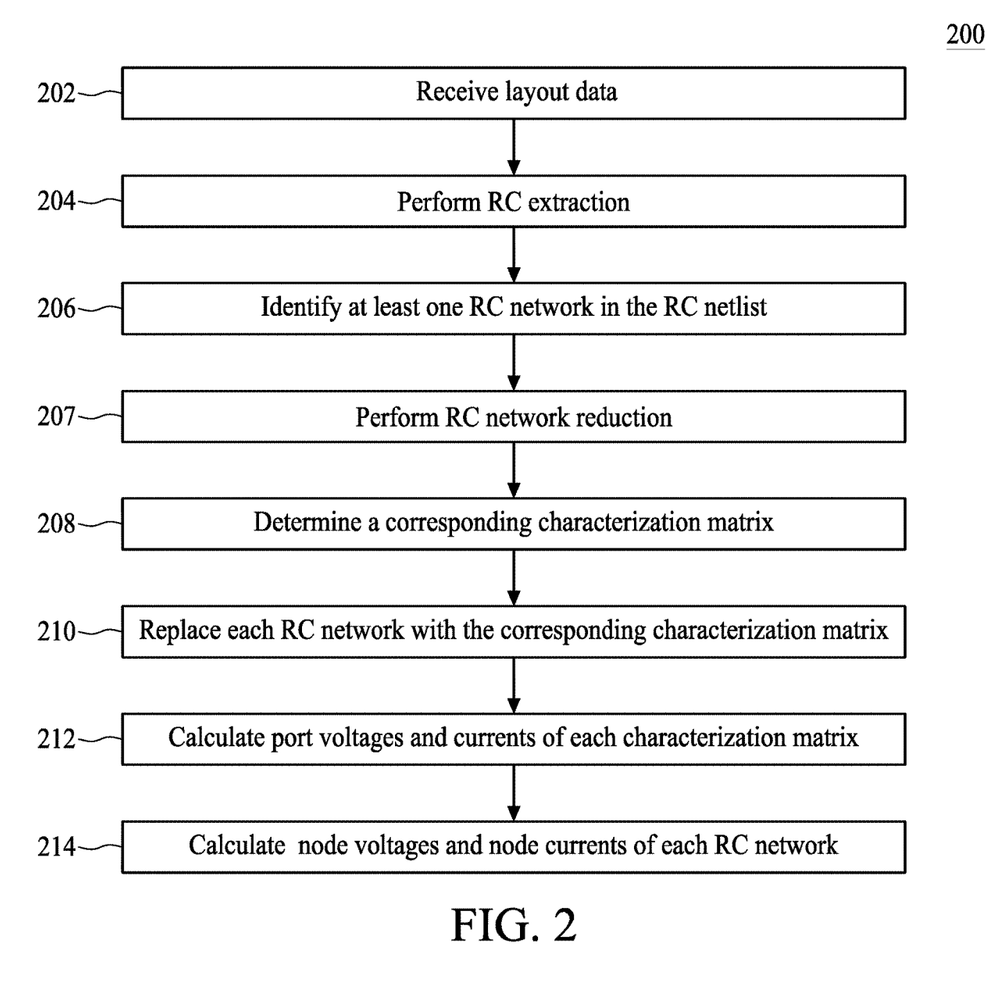
FIG. 2 is a schematic diagram illustrating a design flow of performing a hierarchical modeling operation, in accordance with some embodiments.

FIG. 2 is a schematic diagram illustrating a design flow 200 of a hierarchical modeling operation, in accordance with some embodiments. The design flow 200 may correspond to the LPE operation in stage 160 of FIG. 1. In step 202, a layout data is received. The layout data includes information on the placement and routing of electrical features of the chip. A post-layout netlist corresponding to the layout data is also provided in step 202. In some embodiments, the chip may include an interconnect layer that is formed of stacked conductive interconnection sublayers. The interconnect layer may be formed of horizontal conductive lines interconnected through vertical conductive vias. The interconnect layer provides redistributed connections for the underlying features, such as a field-effect transistor (FET).

In step 204, a parameter extraction operation is conducted based on the interconnect layer structure for incorporating the electrical performance of the interconnect layer into the post-layout netlist. The electrical performance may include different resistance and capacitance values at different locations of the interconnect layer, which may account for a resistance-capacitance (RC) delay. In addition, the electromigration effect or the IR drop performance in each circuit feature of the chip may be evaluated via the layout-dependent parameters. In an embodiment, the layout-dependent parameters may include at least one resistance value for a circuit feature, such as a piece of conductive line or conductive via. In an embodiment, the layout-dependent parameters may include at least one capacitance value to represent a coupling effect between two or more circuit features, such as a capacitive coupling between two neighboring wires. The post-layout netlist may be expanded by adding the layout-dependent parameters. Alternatively, a layout-dependent netlist may be separately provided.

Figure 3:
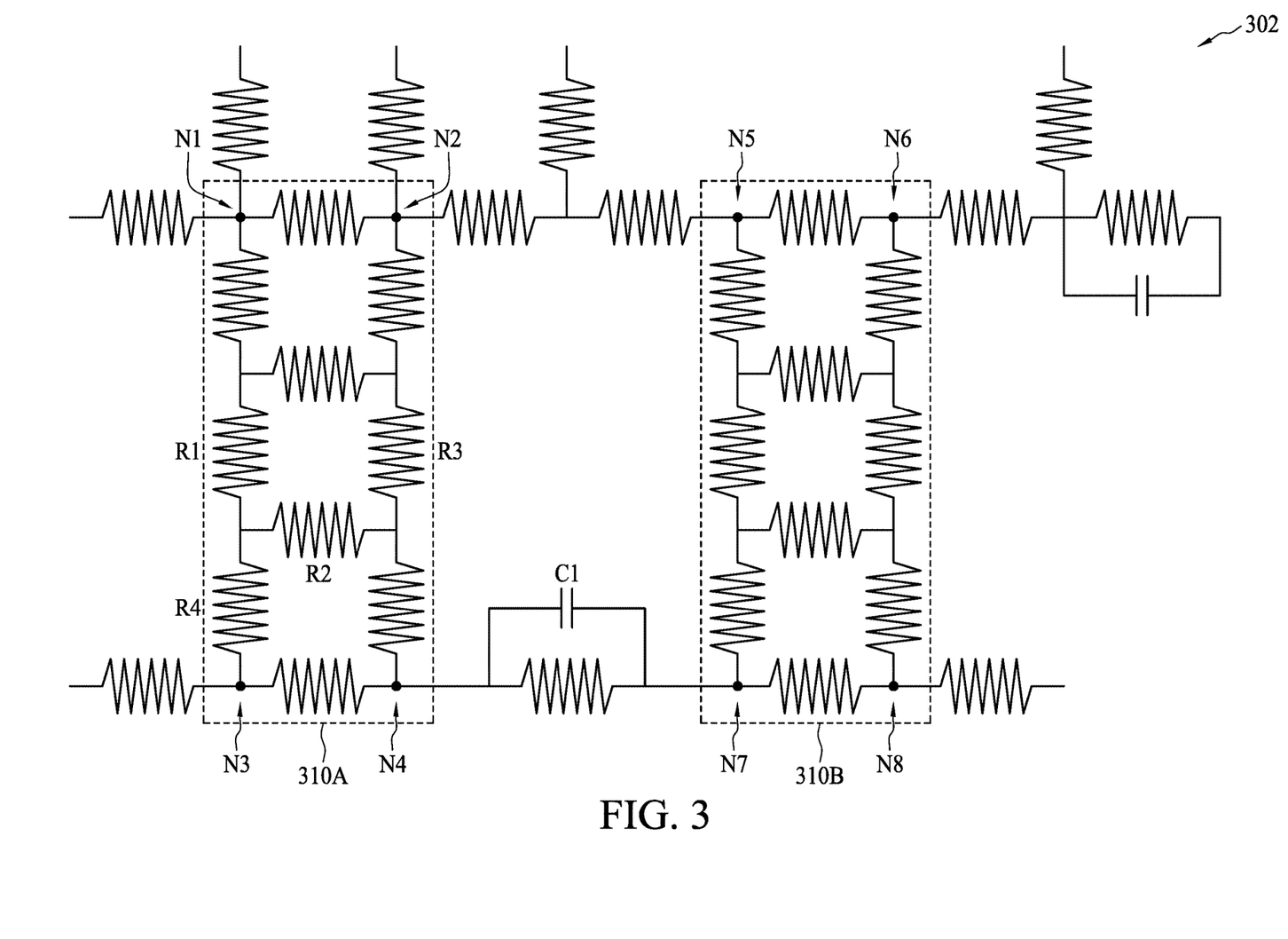
FIG. 3 is a schematic circuit diagram of a chip, in accordance with some embodiments.

Referring to FIG. 3, an exemplary schematic circuit diagram 302 representative of a portion of the chip is illustrated. The circuit diagram 302 shows an equivalent circuit, e.g., of a section in an interconnect layer, of the chip. The circuit diagram 302 can be converted to a respective layout-dependent netlist, which is referred to as a resistor-capacitor (RC) netlist throughout the present disclosure. The circuit diagram 302 constitutes of several circuit nodes interconnected through resistors or capacitors, such as resistor R1 and capacitor C1. The netlist may also include circuit nodes corresponding to the nodes in the circuit diagram 302. Each resistor is assigned a resistance value, and each capacitor is assigned a capacitance value. The electrical properties in each part of the interconnect layer, such as resistance and capacitance, are reflected in the respective voltages, currents, and capacitances. The more circuit nodes that are allowed in the circuit diagram 302, the higher simulation accuracy the circuit diagram 302 can provide. The numbers of circuit nodes and topology of the circuit pattern 302 shown in FIG. 3 are illustrative only. Other numbers of circuit nodes and topology configurations are within the contemplated scope of the present disclosure.

In step 206, at least one RC network in the circuit diagram 302 is identified. In an embodiment, the identification of the RC network can be done through the format of the RC netlist. An RC network refers to a subset of the RC netlist and comprises a network of resistors and capacitors. At the minimum, a single resistor or a single capacitor suffices to form an RC network. Still referring to FIG. 3, two RC networks 310A and 310B are identified and indicated in the circuit diagram 302. In the depicted embodiment, the RC networks 310A and 310B share a common circuit topology. In another embodiment, the RC networks 310A and 310B have different circuit topologies but exhibit a same electrical behavior. For example, the RC network 310A is equivalent to the RC network 310B, or vice versa. In other words, the RC networks 310A and 310B are interchangeable. The RC network 310A or 310B may also include one or more capacitors, although not shown in FIG. 3. The RC network 310A or 310B is coupled to the remaining portion of the circuit diagram 302 (i.e., the RC netlist) through at least one circuit node, such as circuit nodes N1, N2, N3 and N4 for the RC network 310A and circuit nodes N5, N6, N7 and N8 for the RC network 310B.

Figure 3A:
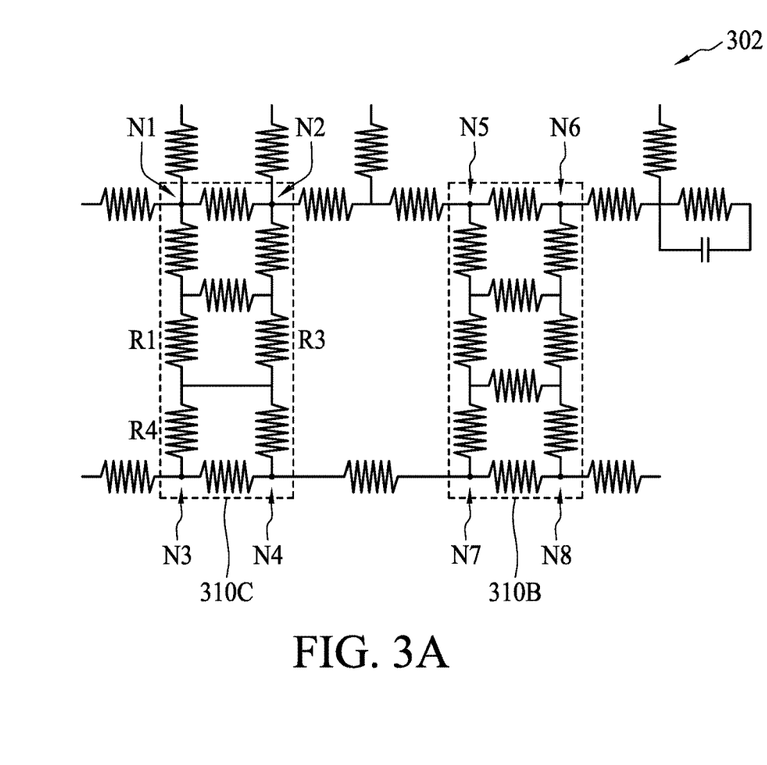
FIGS. 3A and 3B are schematic circuit diagrams for a chip subjected to a reduction operation, in accordance with some embodiments.

In some embodiments, an RC network reduction is optionally performed, as demonstrated in step 207. The goal of the RC network reduction is to reduce the quantity of nodes within the RC network in order to lower the computational burden of the RC network modeling. In an embodiment, FIG. 3A shows that the RC network 310A is reduced to an RC network 310C by removing a resistor R2. As such, the nodes on two sides of the resistor R2 are joined together and regarded as a single node. In an embodiment, the RC network 310A is reduced by changing the resistance value of the resistor R2 rather than completely removing resistor R2. The reason for changing the resistance of R2 is to allow the reduced RC network 310A to better fit a category of characterization matrix, as will be explained in subsequent paragraphs. In an embodiment, the RC network 310A is reduced by removing the capacitor C1, as shown in FIG. 3A. In an embodiment, during the operation of an RC network reduction, one or more capacitors are eliminated in response to the removal of resistors. In some embodiments, the capacitors are rearranged to connect other circuit nodes or their capacitances are modified if they are not eliminated.

Figure 3B:
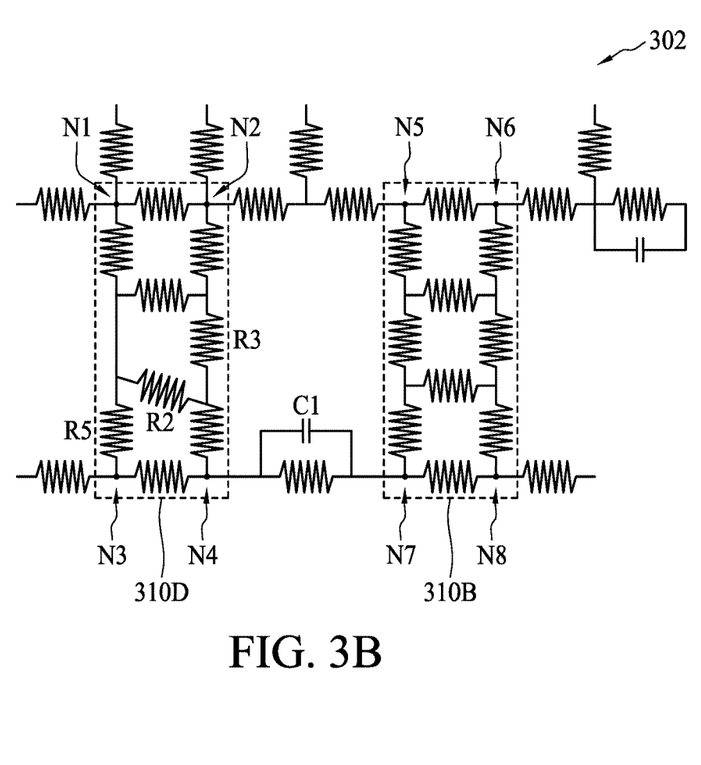

In another embodiment, FIG. 3B shows that the RC network 310A is reduced to an RC network 310D by merging resistors R1 and R4 into another resistor R5. As such, the node connecting the resistors R1 and R4 is eliminated. Under such situation, a modification of connection for the remaining resistors or capacitors may be necessary. For example, the resistor R2 is reallocated through being reconnected to one end of the resistor R5. A topology refinement algorithm may be utilized to determine an updated topology of the reduced RC network 310D so as to lower the modeling error as much as possible.

Figure 4:
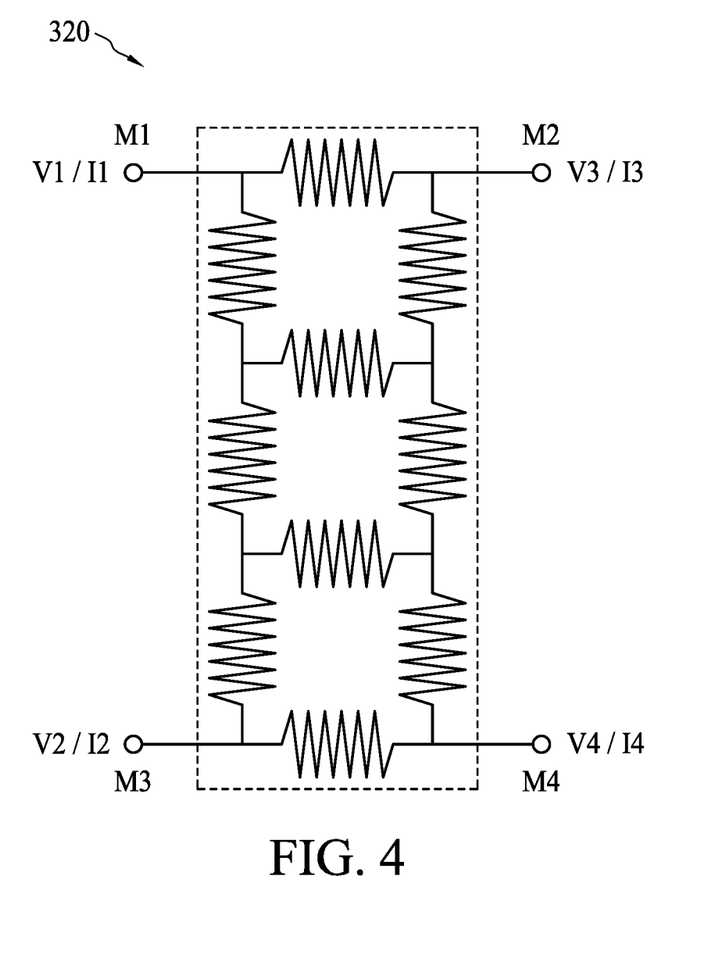
FIG. 4 is a schematic circuit diagram of a characterization matrix, in accordance with some embodiments.

Subsequently, in step 208, a characterization matrix 320 is determined for characterizing an RC network. The RC network to be characterized can be an unreduced RC network or a reduced RC network. The characterization matrix 320 is applied as an equivalent circuit of the corresponding RC network without mentioning the circuit features inside the RC network. In the depicted example, the characterization matrix 320 is used as an equivalent circuit of the RC networks 310A and 310B, as shown in FIG. 4. The characterization matrix 320 has four input/output (I/O) ports M1 through M4 corresponding to the circuit nodes N1 through N4 for the RC network 310A or the circuit nodes N5 through N8 for the RC network 310B. Electrical properties of the ports M1 through M4, such as the port voltages (i.e., V1 through V4) and port currents (i.e., I1 through I4) are related to each other based on the topology and values of the resistors and capacitors within the characterization matrix 320. In an embodiment, the characterization matrix 320 is described through a matrix of simultaneous equations, such as an H matrix, a Y matrix, or a Z matrix, with voltages and currents of ports M1 through M4 as inputs and outputs.

In the embodiment of a Z matrix with entries $z_{ij}$, the relationships of the port voltages and port currents are represented by the following equation:

$$\begin{bmatrix} V_1 \\ \vdots \\ V_4 \end{bmatrix} = \begin{bmatrix} z_{11} & \cdots & z_{14} \\ \vdots & \ddots & \vdots \\ z_{41} & \cdots & z_{44} \end{bmatrix} \begin{bmatrix} I_1 \\ \vdots \\ I_4 \end{bmatrix} \quad (1)$$

In the embodiment of a Y matrix with entries $y_{ij}$, the relationships of the port voltages and port currents are represented by the following equation:

$$\begin{bmatrix} I_1 \\ \vdots \\ I_4 \end{bmatrix} = \begin{bmatrix} y_{11} & \cdots & y_{14} \\ \vdots & \ddots & \vdots \\ y_{41} & \cdots & y_{44} \end{bmatrix} \begin{bmatrix} V_1 \\ \vdots \\ V_4 \end{bmatrix} \quad (2)$$

In the embodiment of an H matrix with entries $h_{ij}$, the relationships of the port voltages and port currents for a representative two-port H matrix are represented by the following equation:

$$\begin{bmatrix} V_1 \\ I_2 \end{bmatrix} = \begin{bmatrix} h_{11} & h_{12} \\ h_{21} & h_{22} \end{bmatrix} \begin{bmatrix} I_1 \\ V_2 \end{bmatrix}. \quad (3)$$

It can be appreciated by persons skilled in the art that a multiple-port H matrix with a port quantity greater than two can be extended from the two-port H matrix by assigning appropriate inputs and outputs selected from the variables of V1 through V4 and I1 through I4. In some embodiments, each of the different forms of the characterization matrix 320, i.e., Y matrix, H matrix, and Z matrix, can be converted to another form through appropriate matrix manipulation. The entries $z_{ij}$, $y_{ij}$, and $h_{ij}$, for the characterization matrices Z, Y and H, respectively, are determined based on the circuit topology and the resistance/capacitance of the circuit feature in the RC network to be replaced. Once the equations for the characterization matrix 320 are established with the values of entries obtained, the characterization matrix 320 is prepared and the flow 200 proceeds to step 210.

Figure 5:
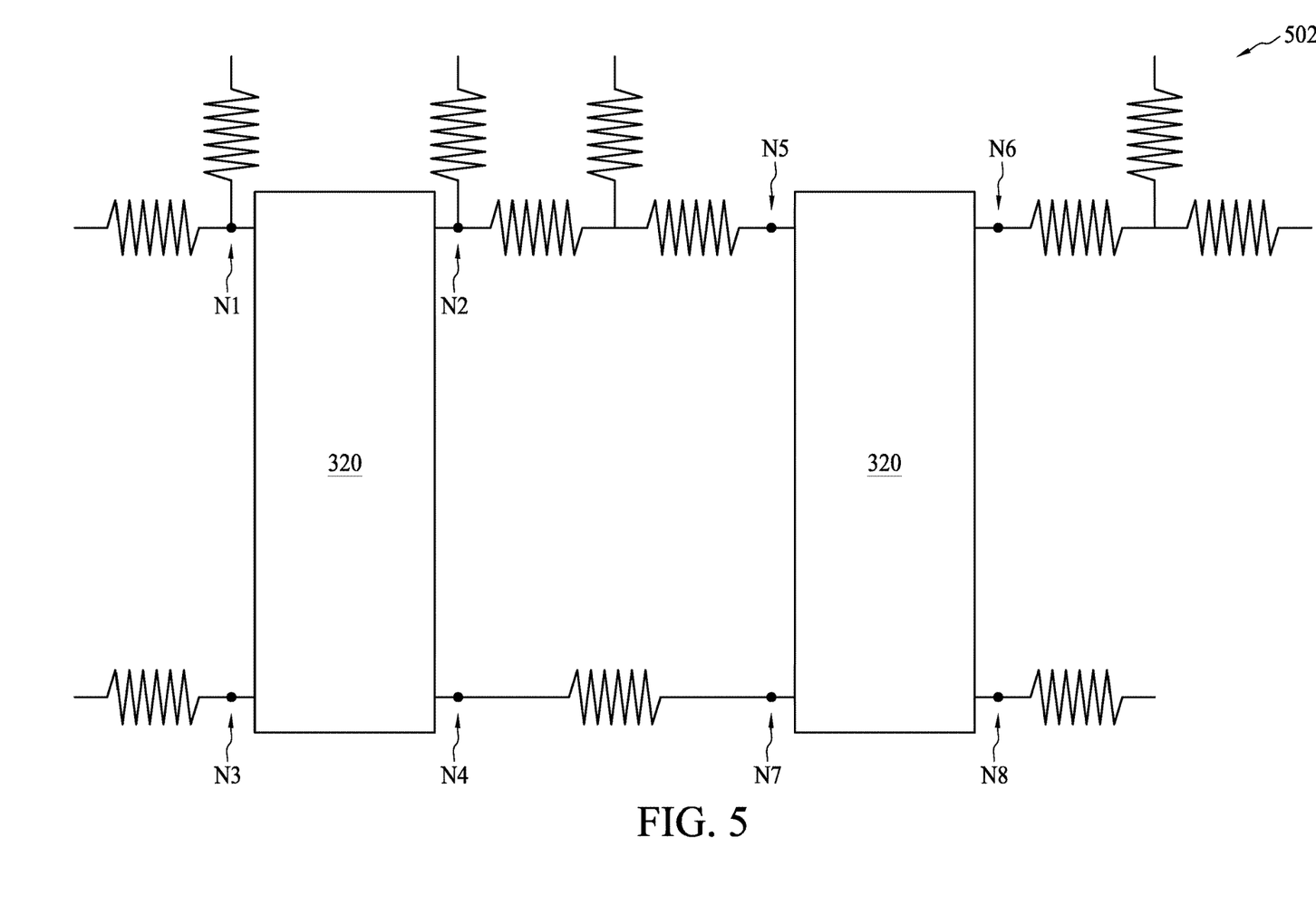
FIG. 5 is a schematic circuit diagram of a chip incorporating the characterization matrix in FIG. 4, in accordance with some embodiments.

Referring back to FIG. 2, in step 210, at least one RC network of the RC netlist is replaced with a corresponding characterization matrix. In the depicted sample, the characterization matrix 320 is utilized to replace the RC network 310A or 310B. FIG. 5 demonstrates a schematic circuit diagram 502, which shows the circuit diagram 302 with two characterization matrices 320 in place of the RC networks 310A and 310B. Alternatively, the RC netlist can be rewritten by replacing the interconnections within the RC network 310A or 310B with the equations of the characterization matrix 320 shown in equations (1) through (3). Circuit nodes N1, N2, N3 and N4 are used to interface the first characterization matrix 320 with the remaining portions of the RC netlist. Similarly, circuit nodes N5, N6, N7 and N8 are used to interface the second characterization matrix 320 with the remaining portions of the RC netlist. It should be noted that the RC network 310A or 310B and the characterization network 320 can be converted to each other, and thus the electrical performances of the two circuit diagrams 302 and 502 should not be the same. Consequently, the resultant circuit diagram 502 has fewer circuit nodes than its counterpart circuit diagram 302. In an embodiment, multiple characterization matrices are applied to a circuit diagram or an RC netlist. A higher percentage of replacement of the characterization matrix corresponds to a larger reduction of circuit nodes of the circuit diagram. Accordingly, the quantity of nodes of the updated circuit diagram (or RC netlist) and the corresponding computational burden are reduced.

As discussed previously, as long as more RC networks can be identified in the RC netlist, the modeling of the circuit diagram 320 can undergo additional computational reduction due to elimination of circuit nodes. In addition, if the identified RC networks can be grouped, and a characterization matrix identified for replacement, then the simulation efforts can be further reduced. In an embodiment, the RC networks 310A and 310B can be replaced with different characterization matrices if they have different circuit topologies. In some embodiments where the RC networks 310A and 310B are different, at least one of the RC network 310A and 310B may be subjected to a reduction operation and converted to reduced RC networks (e.g., a reduction approach exemplified for the RC networks 310C and 310D). When one or more among the multiple RC networks are reduced, they can be considered identical and share a same characterization matrix as replacement. The computational efforts can be reduced by cutting off the utilization of an additional characterization matrix for the different RC network.

Still referring to FIG. 2, in step 212, a first-step simulation of the hierarchical modeling is conducted. The simulation is performed against the updated RC netlist corresponding to the circuit diagram 502. A software simulation platform, e.g. SPICE, may be leveraged to perform the simulation task. Electrical properties, such as node voltages and node currents, are calculated. In an embodiment, the calculation of the node voltages and node currents is performed through solving simultaneous equations of all nodes. However, the circuit nodes inside the RC networks 310A and 310B are not taken into consideration during the present round of calculation since the relationships of such nodes on the circuit diagram 502 are expressed by the equations of the characterization matrix 320. The node voltages and node currents at circuit nodes N1 through N8 are calculated, although they are also regarded part of the characterization matrix 320. Those node voltages and node currents for nodes N1 through N8 may be stored or recorded for a second-step simulation.

Next, the second-step simulation of the hierarchical modeling is conducted, as illustrated in step 214. Referring to FIG. 4, the voltages and currents of the circuit nodes inside the RC networks 310A and 310B are calculated. Accordingly, the overall modeling of the circuit diagram 302 is completed. The voltages and currents of the RC networks 310A and 310B can be obtained using the characterization matrix 320 based on the topology of the circuit diagram 320 and the calculated node voltages/currents at N1 through N8 obtained in step 212. For example, the circuit nodes within the RC network 310A are processed by substituting the voltages and currents of circuit nodes N1 through N4 obtained in step 212 into the port voltages/currents of ports M1 through M4, respectively, of the characterization matrix 320. Similarly, the circuit nodes within the RC network 310B are processed by substituting the voltages and currents of circuit nodes N5 through N8 derived in step 212 into the port voltages/currents of ports M1 through M4, respectively, of the characterization matrix 320. In an embodiment where the RC networks 310A and 310B have different circuit topologies, separate calculation procedures are applied to the RC networks 310A and 310B. In alternative embodiments, assume the RC networks 310A and 310B are subjected to a reduction operation and share a common characterization matrix 320 with the RC network 310B. In such situation, a node restoration operation may be performed in which the reduced circuit features of the RC network 310A can be restored. The restored RC network 310A is subjected to the second-step simulation in step 214. Therefore, the RC network 310A may have a node quantity different from that of the RC network 310B. The node voltages and currents between the two RC networks 310A and 310B may also be different due to the node restoration operation.

In an embodiment, a timing analysis is performed based on the updated netlist and the calculated voltages and currents of the plurality of circuit nodes obtained in step 214. The timing analysis result will determine if the post-layout netlist meets the specifications, specifically for a digital circuit.

Figure 6A:
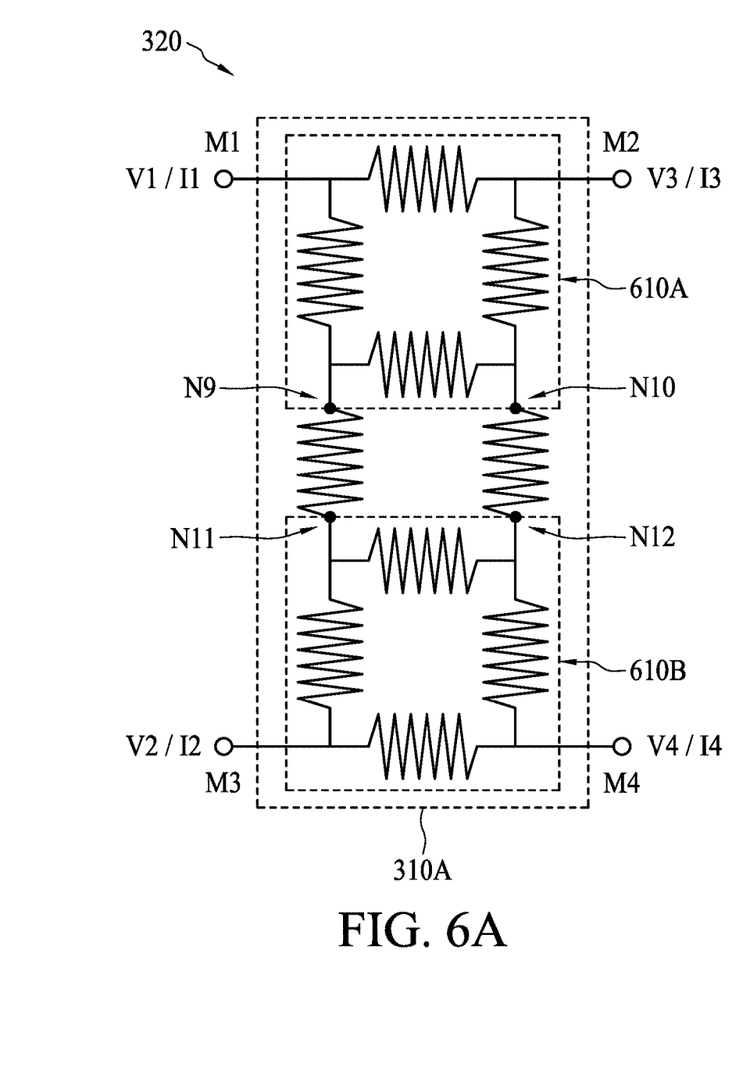
FIG. 6A is a schematic circuit diagram of a chip, in accordance with some embodiments.
Figure 6B:
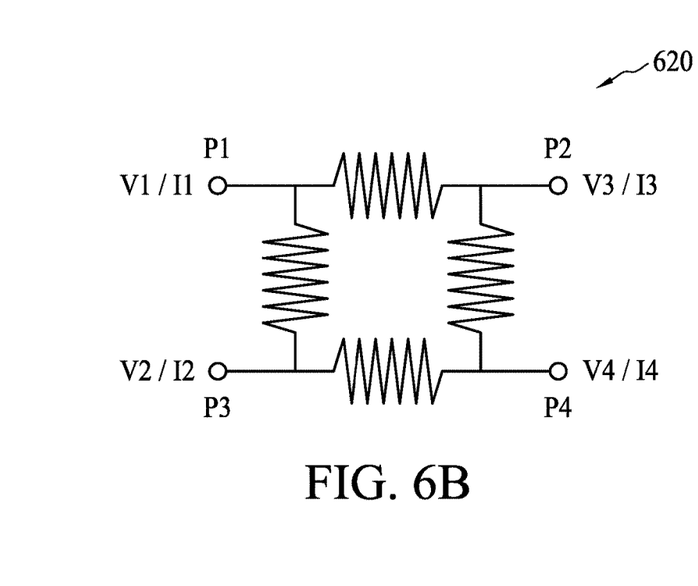
FIG. 6B is a schematic circuit diagram of a characterization matrix, in accordance with some embodiments.

The proposed hierarchical modeling architecture can be made more efficient if a nested characterization matrix is formed. FIG. 6A is a schematic circuit diagram representing the characterization matrix 320. An RC network 610A is identified within the RC network 310A. The RC network 610A can be regarded as an RC subnetwork of the RC network 310A. Further, another RC network 610B, which is identical to the RC subnetwork 610A, is also found within the RC network 310A. The RC network 610B can be regarded as another RC subnetwork of the RC network 310A. A characterization matrix 620 is illustrated in FIG. 6B. The characterization matrix 620 includes four ports P1 through P4 to communicate with the remaining circuit features of the characterization matrix 320. The characterization matrix 620 is employed to replace the RC subnetwork 610A or 610B, and can be regarded as a characterization submatrix of the characterization matrix 320. In other words, the characterization matrix 320 and characterization submatrix 620 form a nested characterization matrix structure. As such, the RC network 310A can be replaced by the characterization matrix 320 and the characterization matrix 620 recursively. In an embodiment, when the characterization matrix 620 is used to replace the RC submatrix 610A, the ports P1 and M1 are seen as the same node. Similarly, the ports P2 and M2 are seen as the same node. Moreover, when the characterization matrix 620 is used to replace the RC submatrix 610B, the ports P3 and M3 are seen as the same node, and the ports P4 and M4 are seen as the same node. Thus, repeated calculation efforts for the above-mentioned shared ports can be saved.

Figure 7:
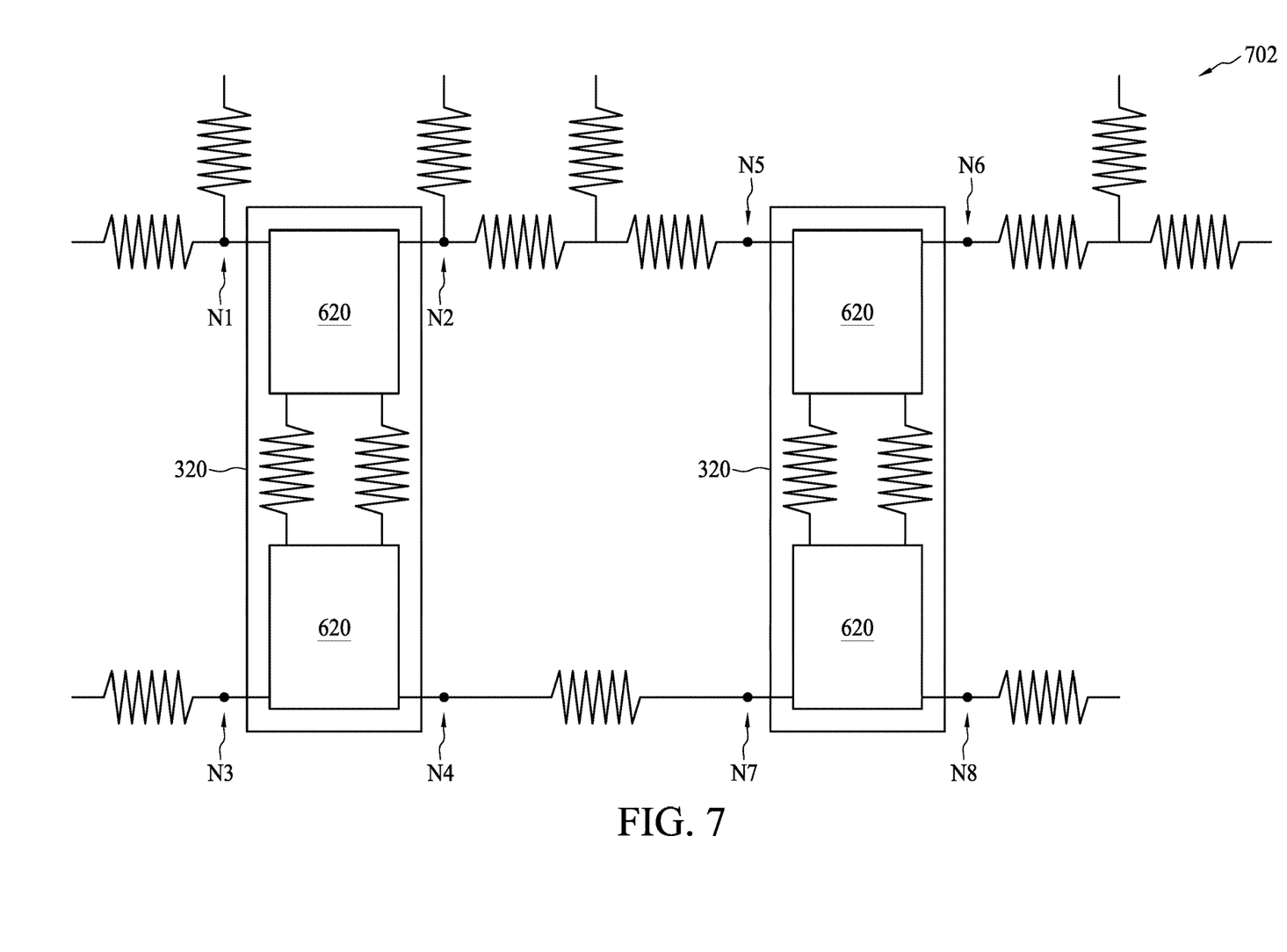
FIG. 7 is a schematic circuit diagram of a chip incorporating a nested characterization matrix structure in FIG. 6A, in accordance with some embodiments.

FIG. 7 demonstrates a schematic circuit diagram 702, which shows the circuit diagram 502 with four characterization sub-matrices 620 in place of the RC subnetworks 610A and 610B in the RC networks 310A and 310B. Alternatively, the RC netlist can be further rewritten by replacing the interconnections within the RC subnetwork 610A or 610B with equations similar to the equations (1) to (3). Consequently, the resultant circuit diagram 502 has fewer circuit nodes than its counterpart circuit diagram 302. In an embodiment, multiple characterization matrices are applied to a circuit diagram or RC netlist. As can be observed, the quantity of nodes in the first-step simulation that are fed to the SPICE platform is less than the quantity of nodes in FIG. 5. Accordingly, the corresponding computational burden can be further reduced.

Figure 8:
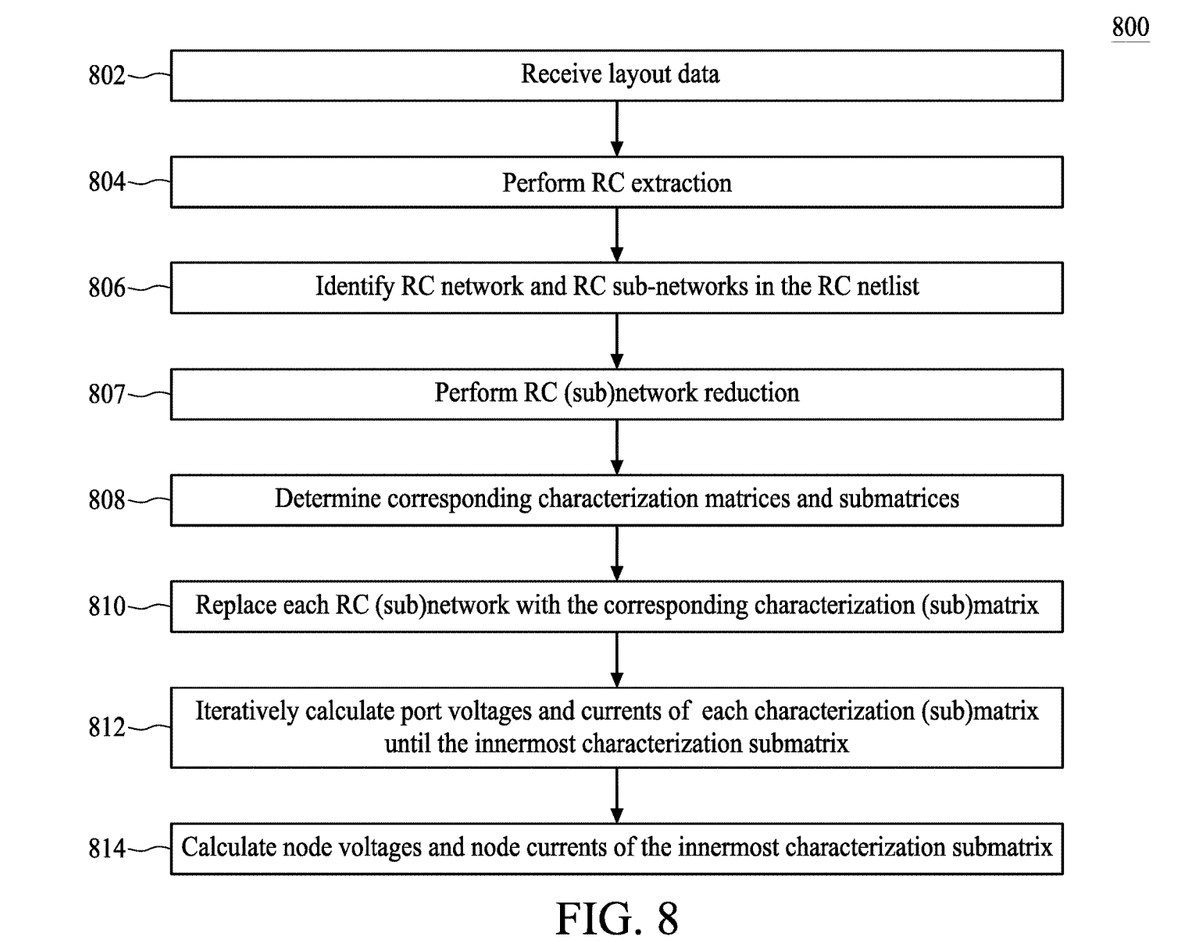
FIG. 8 is a schematic diagram illustrating a design flow of performing a hierarchical modeling operation, in accordance with some embodiments.

FIG. 8 is a schematic diagram illustrating a design flow 800 of performing a hierarchical modeling operation, in accordance with some embodiments. The design flow 800 is similar to the design flow 200 shown in FIG. 2, except that a nested modeling framework is incorporated. The operations and structures in each step of the flow 800 refer to the detailed descriptions for the design flow 200 for simplicity and clarity except where otherwise indicated.

In step 802, a post-layout data corresponding to a circuit diagram, e.g., circuit diagram 302, is received. In step 804, an RC extraction operation is performed on the post-layout data. In step 806, at least one RC network and one RC subnetwork are identified.

In step 807, an RC network reduction operation or an RC subnetwork reduction is optionally performed. The reduction operation can be performed on one or more of the identified RC network and RC subnetworks. In step 808, at least one characterization matrix and one characterization submatrix are determined for characterizing an RC network and an RC subnetwork. In step 810, at least one RC network and one RC subnetwork are replaced with a corresponding characterization matrix and its characterization submatrix. An exemplary circuit diagram 702 is obtained.

In step 812, an iterative procedure for calculating the node voltages and node currents are performed. The ports in an inner characterization matrix (i.e., a characterization submatrix) are calculated subsequent to the calculation of its outer characterization matrix. Taking the circuit diagram 702 as an example, a first-step simulation of the hierarchical modeling is initially conducted using the updated circuit diagram 702. Voltages and currents of the nodes that remain in the circuit diagram 702 are calculated. In the meantime, the port voltages and port currents of the characterization matrix 320 are also obtained, in an operation similar to that of step 212. Next, the voltages and port currents of the nodes within the characterization submatrix 620, e.g., the nodes N9, N10, N11 and N12 shown in FIG. 6A, are calculated. If the characterization submatrix 620 has more layers of submatrices therewithin, the step 812 proceeds with calculation of each characterization submatrix until the innermost characterization submatrix.

In step 814, the node voltages and node currents of the innermost characterization submatrix are calculated, in a manner similar to that of step 201. The overall node voltages and node currents are completed.

Figure 9:
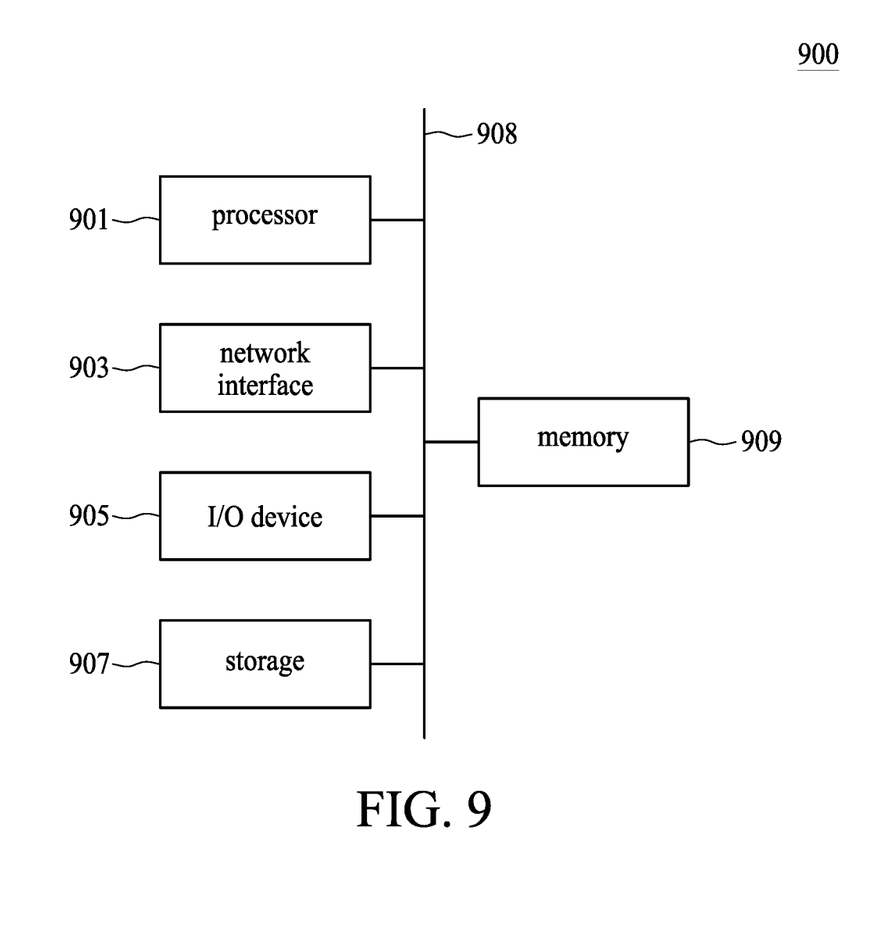
FIG. 9 is a schematic diagram of a system implementing layout designs, in accordance with some embodiments.

FIG. 9 is a schematic diagram of a system 900 implementing layout designs, in accordance with some embodiments. The system 900 includes a processor 901, a network interface 903, an input and output (I/O) device 905, a storage 907, a memory 909, and a bus 908. The bus 908 couples the network interface 903, the I/O device 905, the storage 907, the memory 909 and the processor 901 to each other.

The processor 901 is configured to execute program instructions that include a tool configured to perform the method as described and illustrated with reference to figures of the present disclosure. Accordingly, the tool is configured to execute the steps such as: provide design specifications, generate a netlist of a circuit, perform pre-layout simulation, generate an initial layout, identify at least one RC network in the initial layout, generate a reduced netlist by replacing the RC network with a corresponding characterization matrix, calculate node voltages and node currents of the nodes in the netlist, perform post-layout simulation and verify the post-layout simulation result.

The network interface 903 is configured to access program instructions and data accessed by the program instructions stored remotely through a network (not shown).

The I/O device 905 includes an input device and an output device configured for enabling user interaction with the system 900. In some embodiments, the input device comprises, for example, a keyboard, a mouse, and other devices. Moreover, the output device comprises, for example, a display, a printer, and other devices.

The storage device 907 is configured for storing program instructions and data accessed by the program instructions. In some embodiments, the storage device 907 comprises a non-transitory computer readable storage medium, for example, a magnetic disk and an optical disk. Other forms of storage medium are also within the contemplated scope of the present disclosure.

The memory 909 is configured to store program instructions to be executed by the processor 901 and data accessed by the program instructions. In some embodiments, the memory 909 comprises any combination of a random access memory (RAM), some other volatile storage device, a read only memory (ROM), and some other non-volatile storage device, such as flash memory.

The proposed hierarchical modeling architecture is advantageous in several aspects. By observing that the power delivery structure of a chip contains a few repeated electrical structures, those repeated electrical structures can be simplified by a representative RC network. For example, a power delivery network may be constructed with many repeated hierarchical and nested networks. Utilizing the proposed hierarchical modeling architecture may be helpful in reducing duplicated computations for the repeated networks. As a result, repeated simulation resources can be significantly reduced, thus saving the processing time. In some configurations, the proposed hierarchical modeling architecture does not sacrifice simulation accuracy. Moreover, the proposed scheme is flexible in supporting different types of RC networks, and can accommodate an arbitrary number of ports for the RC network. In addition, the proposed architecture is compatible with current parallel processing platforms for further improving multiple thread operations at the same time.

According to an embodiment, a method performed by at least one processor includes: accessing a layout of an integrated circuit (IC), the layout comprising a resistor-capacitor (RC) netlist comprising a plurality of circuit nodes; identifying an RC network in the RC netlist; determining a characterization matrix corresponding to the RC network; updating the RC netlist by replacing the RC network with the characterization matrix; and calculating voltages and currents of the plurality of circuit nodes based on the updated RC netlist.

According to an embodiment, a system comprises one or more processors and one or more programs including instructions which, when executed by the one or more processors, cause the system to: access a layout of an integrated circuit (IC), the layout comprising a resistor-capacitor (RC) netlist comprising a plurality of circuit nodes; identify an RC network in the RC netlist; determine a characterization matrix corresponding to the RC network; update the RC netlist by replacing the RC network with the characterization matrix; and calculate voltages and currents of the plurality of circuit nodes based on the updated RC netlist.

According to an embodiment, a non-transitory computer readable storage medium comprises instructions which, when executed by a processor, perform the steps of: accessing a layout of an integrated circuit (IC), the layout comprising a resistor-capacitor (RC) netlist comprising a plurality of circuit nodes; identifying an RC network in the RC netlist; determining a characterization matrix corresponding to the RC network; updating the RC netlist by replacing the RC network with the characterization matrix; and calculating voltages and currents of the plurality of circuit nodes based on the updated RC netlist.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, performed by at least one processor, comprising:
   accessing a layout of an integrated circuit (IC), the layout comprising a resistor-capacitor (RC) netlist comprising a plurality of circuit nodes;
   identifying an RC network in an entirety of the RC netlist, the RC netlist comprising first circuit nodes coupling second circuit nodes in the RC network to remaining circuit nodes of the RC netlist;
   determining a characterization matrix characterizing the RC network, wherein the characterization matrix comprises ports corresponding to the first circuit nodes;
   updating the RC netlist to form an updated RC netlist by replacing the RC network with the characterization matrix; and
   calculating first voltages and first currents of the ports and the remaining circuit nodes in the updated RC netlist prior to calculating second voltages and second currents of the second circuit nodes.

2. The method according to claim 1, wherein the characterization matrix is selected from a group consisting of Y matrix, H matrix and Z matrix.

3. The method according to claim 1, wherein determining a characterization matrix characterizing the RC network comprises determining entries of the characterization matrix based on a circuit topology of the RC network.

4. The method according to claim 1, wherein calculating first voltages and first currents of the ports in the updated RC netlist comprises calculating the first voltages and the first currents of the ports according to predetermined equations of the characterization matrix.

5. The method according to claim 1, further comprising calculating the second voltages and the second currents of the second circuit nodes based on the first voltages and the first currents of the ports.

6. The method according to claim 1, wherein replacing the RC network of the RC netlist with a characterization matrix comprises:
   performing an RC network reduction operation on the RC network to form a reduced RC network by removing at least one of a resistor and a capacitor of the RC network; and
   replacing the reduced RC network with the characterization matrix.

7. The method according to claim 1, wherein replacing the RC network of the RC netlist with a characterization matrix comprises:
   performing an RC network reduction operation on the RC network to form a reduced RC network by merging two resistors into another resistor; and
   replacing the reduced RC network with the characterization matrix.

8. The method according to claim 1, wherein the RC netlist comprises a second RC network different from the RC network, and the method further comprises:
   reducing the second RC network to form a reduced RC network identical to the RC network; and
   replacing the reduced RC network with the characterization matrix.

9. The method according to claim 1, further comprising:
   identifying an RC subnetwork in the RC network;
   determining a characterization submatrix corresponding to the RC subnetwork; and
   updating the RC netlist by replacing the RC subnetwork with the characterization submatrix.

10. The method according to claim 9, further comprising calculating voltages and currents of the plurality of circuit nodes based on the updated RC netlist.

11. A system, comprising one or more processors and one or more programs including instructions which, when executed by the one or more processors, cause the system to:
    access a layout of an integrated circuit (IC), the layout comprising a resistor-capacitor (RC) netlist comprising a plurality of circuit nodes;
    identify a first RC network and a second RC network different from the first RC network in the RC netlist;
    determine a characterization matrix characterizing the first RC network;
    modify the second RC network to form a third RC network identical to the first RC network;
    update the RC netlist to form an updated RC netlist by replacing the first and the third RC networks with the characterization matrix; and
    calculate voltages and currents of the plurality of circuit nodes based on the updated RC netlist.

12. The system according to claim 11, further comprising performing an RC extraction operation, wherein the RC netlist is obtained based on the RC extraction operation.

13. The system according to claim 11, further comprising performing a timing analysis based on the updated RC netlist and the calculated voltages and currents of the plurality of circuit nodes.

14. The system according to claim 11, wherein the characterization matrix comprises a port, and wherein calculating voltages and currents of the plurality of circuit nodes based on the updated RC netlist comprises calculating a voltage and a current of the port.

15. The system according to claim 14, wherein the RC network comprises a plurality of nodes, and calculating voltages and currents of the plurality of circuit nodes based on the updated RC netlist further comprises calculating a voltage and a current of each of the plurality of circuit nodes in the RC network based on the voltage and the current of the port.

16. The system according to claim 11, wherein modifying the second RC network to form a third RC network comprises performing an RC network reduction operation by merging a first resistor and a second resistor in the second RC network.

17. The system according to claim 16, further comprising reallocating a third resistor of the second RC network in response to the merging of the first resistor and the second resistor.

18. The system according to claim 11, further comprising:
identifying an RC subnetwork in the first RC network;
determining a characterization submatrix characterizing the RC subnetwork; and
updating the RC netlist by replacing the RC subnetwork with the characterization submatrix.

19. A non-transitory computer readable storage medium, comprising instructions which, when executed by a processor, perform the steps of:
accessing a layout of an integrated circuit (IC), the layout comprising an initial netlist;
performing a parameter extraction operation to convert the initial netlist into a resistor-capacitor (RC) netlist comprising a plurality of circuit nodes;
identifying an RC network in an entirety of the RC netlist;
determining a characterization matrix characterizing the RC network;
updating the RC netlist to form an updated RC netlist by replacing the RC network with the characterization matrix; and
calculating voltages and currents of the plurality of circuit nodes in the updated RC netlist.

20. The non-transitory computer readable storage medium according to claim 19, wherein the instructions executed by the processor further perform the steps of:
identifying a plurality of RC subnetworks within the RC network; and
performing a reduction operation for at least one of the RC network and the plurality of RC subnetworks.

* * * * *